(12) United States Patent
Sommers

(10) Patent No.: US 6,674,096 B2
(45) Date of Patent: Jan. 6, 2004

(54) LIGHT-EMITTING DIODE (LED) PACKAGE AND PACKAGING METHOD FOR SHAPING THE EXTERNAL LIGHT INTENSITY DISTRIBUTION

(75) Inventor: Mathew L. Sommers, Sagamore Hills, OH (US)

(73) Assignee: GELcore LLC, Valley View, OH (US)

(*) Notice: Subject to any disclaimer, the term of this patent is extended or adjusted under 35 U.S.C. 154(b) by 49 days.

(21) Appl. No.: 09/681,806

(22) Filed: Jun. 8, 2001

(65) Prior Publication Data

US 2002/0185651 A1 Dec. 12, 2002

(51) Int. Cl.[7] .................................... H01L 29/227
(52) U.S. Cl. ..................... 257/98; 257/95; 257/99; 257/100
(58) Field of Search ................. 257/98, 81, 95, 257/99, 100; 362/800

(56) References Cited

U.S. PATENT DOCUMENTS

| | | | | |
|---|---|---|---|---|
| 3,746,853 A | * | 7/1973 | Koshman et al. | 240/41.35 D |
| 3,991,339 A | | 11/1976 | Lockwood et al. | |
| 4,143,394 A | * | 3/1979 | Schoberl | 357/72 |
| 4,337,759 A | | 7/1982 | Popovich et al. | 126/438 |
| 4,638,343 A | * | 1/1987 | Althaus et al. | 357/17 |
| 5,404,869 A | | 4/1995 | Parkyn, Jr. et al. | 126/699 |
| 5,825,051 A | * | 10/1998 | Bauer et al. | 257/82 |
| 6,190,020 B1 | | 2/2001 | Hartley | 362/184 |

FOREIGN PATENT DOCUMENTS

| | | | |
|---|---|---|---|
| JP | 2-51287 | * | 2/1990 |
| JP | 9-18058 | | 1/1997 |
| JP | 10-82916 | * | 3/1998 |

OTHER PUBLICATIONS

Parkyn, William A., Pelka, David G, and Popovich, John, "The Black Hole: Cuspated waveguide–injectors and illuminators for LEDs," 1999.

* cited by examiner

Primary Examiner—Sara Crane
(74) Attorney, Agent, or Firm—Fay, Sharpe, Fagan, Minnich & McKee, LLP

(57) ABSTRACT

An LED package (10) includes LED die (12) mounted onto lead frame (14) and electrically connected thereto whereby LED die (12) is electrically energized through leads (16, 18). An encapsulant (20), preferably an epoxy resin, encapsulates and preferably hermetically seals LED die (12). Encapsulant (20) includes depression (24) defined by preselected curved surfaces (28), at least a portion of which are coated by reflective coating (26). Encapsulant (20) preferably also includes sides (22) with preselected curvature. In operation, LED die (12) emits light (32) directed approximately along LED die surface normal (36). Light rays (32) reflect from reflective surface (26) and reflected rays (38) are subsequently refracted by refracting surface (22) so that refracted rays (40) exit the capsule. The reflecting surface (26) and refracting surface (22) cooperate to convert LED die light distribution (32) into light distribution (40) which appears to emanate from an approximate point source (42).

21 Claims, 5 Drawing Sheets

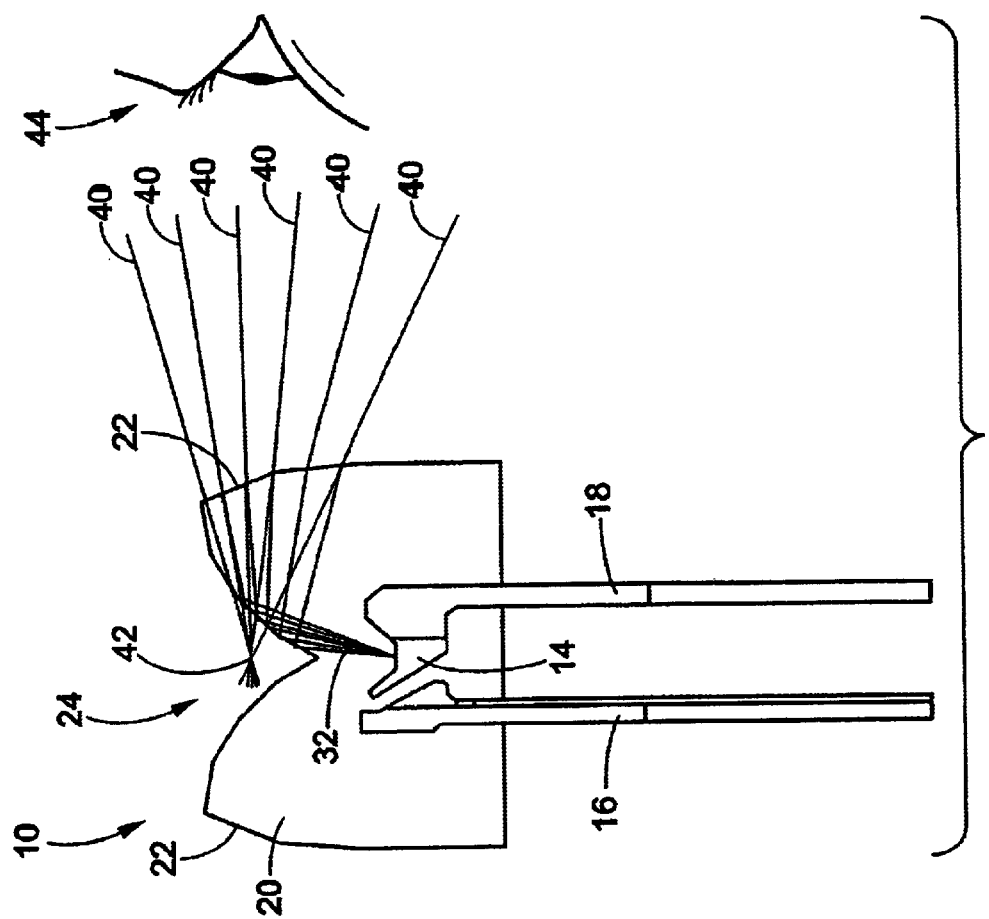
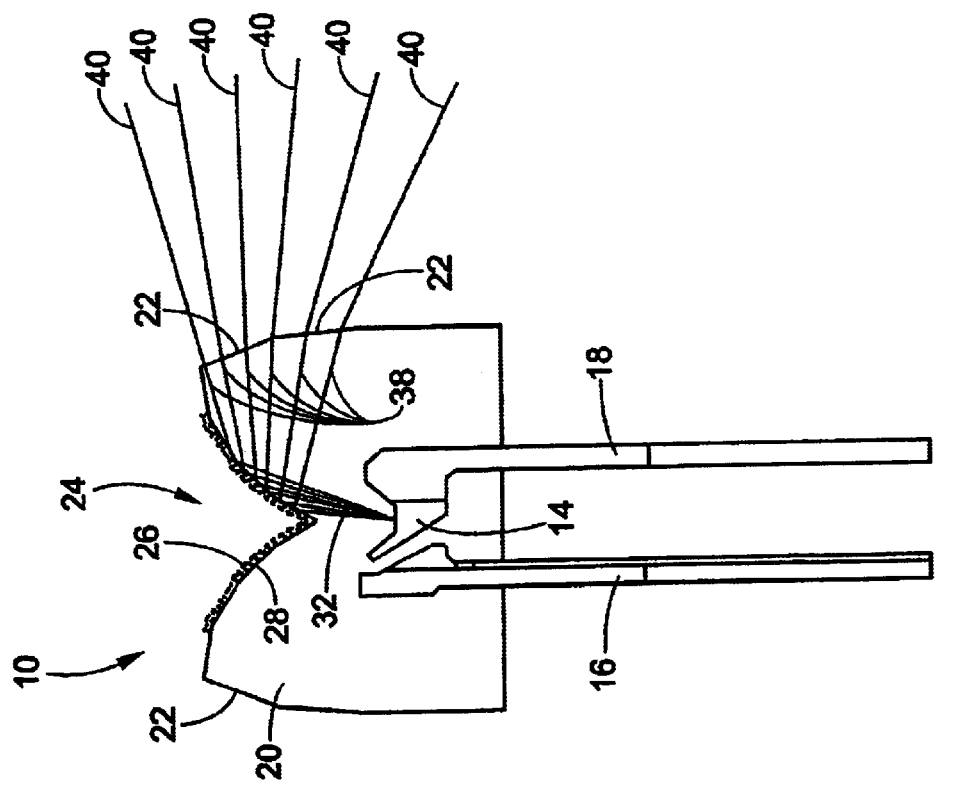
FIG. 3
FIG. 1

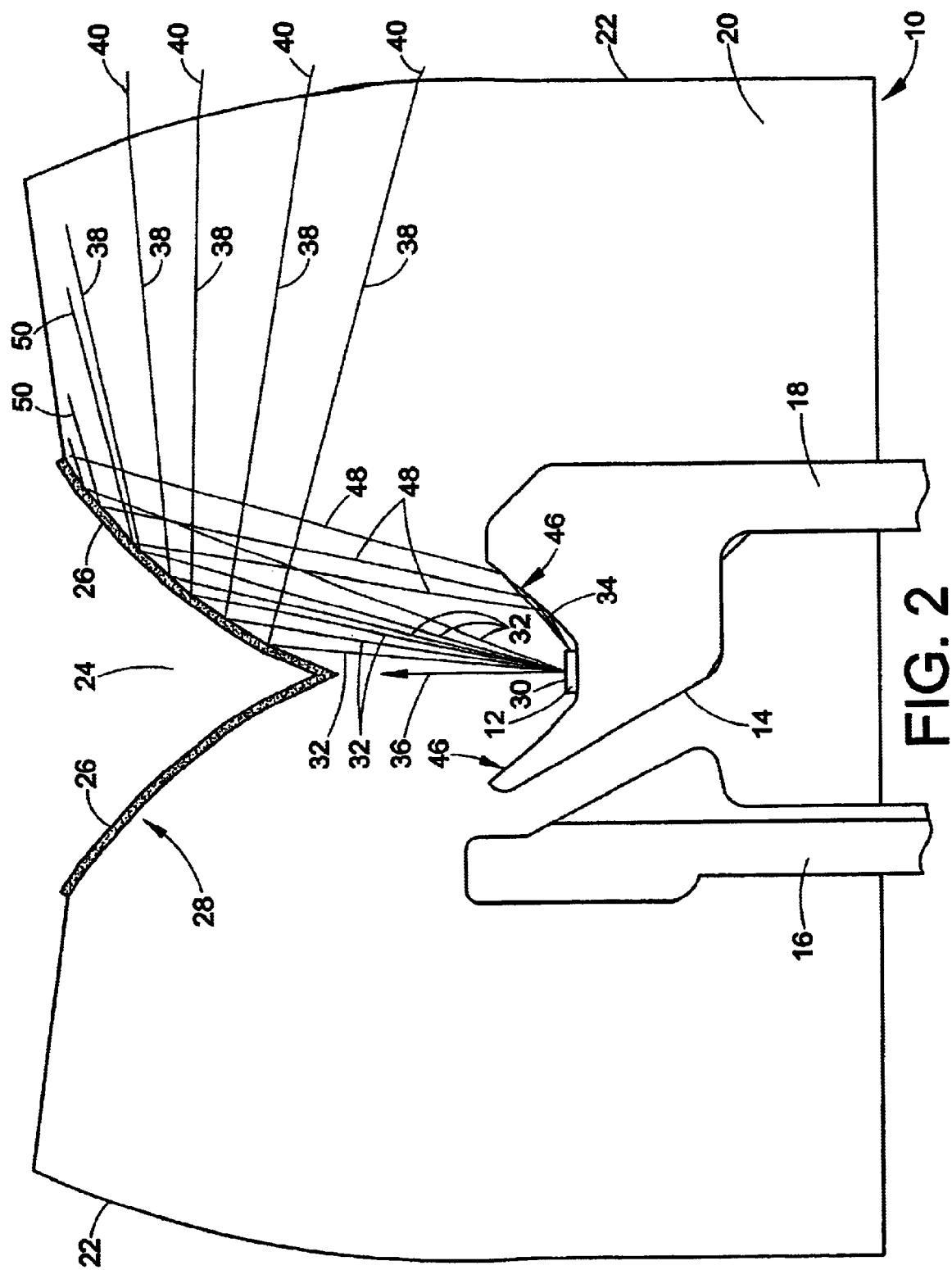

LIGHT-EMITTING DIODE (LED) PACKAGE AND PACKAGING METHOD FOR SHAPING THE EXTERNAL LIGHT INTENSITY DISTRIBUTION

BACKGROUND OF INVENTION

The present invention relates to optical sources, and in particular to light emitting diode (LED) light sources. It is particularly applicable to lighting applications where an LED is contemplated for use as an approximation to a point or line light source, or as an approximation to an extended light source which emits with approximately uniform intensity over an extended solid angle. However, the invention is not so limited, and may find application in other situations where a particular external light emission intensity distribution is required. Also with respect to scope, in the following disclosure the word "light" is to be broadly interpreted to include any applicable spectral range including but not limited to visible, ultraviolet, and infra-red radiation.

LED's have a number of advantages as light sources, such as relatively cool operating temperatures, high achievable wall plug efficiencies, and a wide range of available emission colors extending throughout the visible and into at least the adjacent infra-red and ultraviolet regions dependent upon the choice of semiconductor material. However, LED's have some disadvantages as well, such as poor light coupling through the LED surface which reduces external quantum efficiency, and a highly directional external intensity distribution.

Because of the relatively large refractive index of most LED materials (refractive index n>3 in most cases), internally generated light rays incident upon the LED surface at angles greater than about 20° away from the surface normal experience total internal reflection and do not pass through the LED surface. It is known in the prior art to improve external light coupling during LED packaging through the use of a transparent encapsulant typically in the shape of a hemispherical dome. The encapsulant material is usually an epoxy resin or the like, with a refractive index n~1.5. The encapsulant serves the dual purposes of improving light coupling by reducing total internal reflection losses, and hermetically sealing the LED die.

Although hemispherical dome encapsulation improves LED external light coupling efficiency, it does not significantly change the typically highly directional intensity distribution. An LED is typically an essentially Lambertian source in which the light intensity varies approximately with the cosine of the angle away from the LED surface normal. This intensity distribution strongly enhances light intensity in the forward direction, making the LED a highly directional light source. In contrast, the filament of an incandescent light bulb emits with essentially similar intensity at most viewing angles, and is a reasonable approximation to a point light source, or to a line light source in the case of a longer filament. Therefore, direct replacement of an incandescent source by an LED in a lighting system usually results in very inefficient usage of the LED emission. For example, the parabolic reflector of a flashlight is designed to work with approximately point light source such as an incandescent bulb filament, and does not operate properly on the more directed LED emission distribution.

The prior art does not teach a method for packaging an LED in a manner which produces an external emission intensity distribution that more closely approximates a point or line light source. The present invention contemplates an improved LED package and LED packaging method which overcomes these prior art limitations and others.

SUMMARY OF INVENTION

In accordance with one aspect of the present invention, a light emitting diode (LED) package is disclosed. A transparent encapsulant surrounds the LED die. A reflective surface is disposed on the encapsulant surface essentially opposite the LED die surface.

In accordance with another aspect of the present invention, a method for manufacturing a light-emitting diode (LED) package which emits light in an essentially non-directional manner over at least a predetermined solid angle is disclosed. An LED die is mounted to a lead frame and electrically connected to the leads of the lead frame. At least the LED die is encapsulated in a transparent encapsulant. A reflective coating is applied to a portion of the encapsulant essentially opposite the LED die.

In accordance with another aspect of the present invention, a light emitting diode (LED) capsule is disclosed. An LED die is mounted within a lead frame and electrically connected thereto. A transparent encapsulant encapsulates the LED die and at least a portion of the lead frame. A reflecting surface is disposed on a portion of the encapsulant outer surface. Preferably, the reflecting surface is disposed essentially opposite to the light-emitting surface of the LED die. The capsule preferably further includes a refracting surface which cooperates with the reflecting surface to convert the distribution of the LED light emission intensity into a preselected external light emission intensity distribution. The refracting surface is preferably a portion of the encapsulant outer surface which has a preselected curvature.

In accordance with yet another aspect of the present invention, a light emitting diode (LED) capsule for producing an approximate extended light source with essentially uniform intensity distribution over an extended solid viewing angle is disclosed. An LED die is mounted onto a lead frame and electrically connected thereto. A transparent encapsulant encapsulates the LED die and at least a portion of the lead frame. A roughened surface is disposed on at least a portion of the encapsulant outer surface. Preferably, the roughened surface is a roughened depression in the encapsulant positioned essentially opposite the LED die, and is either filled with a reflective filling disposed within the depression and essentially conforming with the roughness of the roughened surface, or is coated with a reflective coating material which is disposed upon at least a portion of the roughened surface.

One advantage of the present invention is that it provides an LED package with a preferred external light emission intensity distribution.

Another advantage of the present invention is that it provides an LED package which outputs an approximate point light source distribution and is suitable as a replacement for an incandescent light bulb.

Another advantage of the present invention is that it adds only a single manufacturing step over conventional LED packaging, and that additional step is application of a reflective coating which may be realized using any of a number of established methods.

Another advantage of the present invention is that it is implemented at the package level, rather than as an add-on, thereby reducing costs and increasing performance.

Yet another advantage of the present invention is that it provides an LED package which generates an apparent extended light source with an approximately uniform intensity distribution over an extended solid viewing angle.

Still further advantages and benefits of the present invention will become apparent to those of ordinary skill in the art upon reading and understanding the following detailed description.

BRIEF DESCRIPTION OF DRAWINGS

The invention may take form in various components and arrangements of components, and in various steps and arrangements of steps. The drawings are only for purposes of illustrating a preferred embodiment and are not to be construed as limiting the invention.

FIG. 1 is a diagram of one embodiment of the LED package or capsule.

FIG. 2 is an enlarged view of FIG. 1 showing the LED die and associated details.

FIG. 3 is the same embodiment as shown in FIG. 1 but including ray tracing identifying the virtual approximate point source.

DETAILED DESCRIPTION

Figure 5:
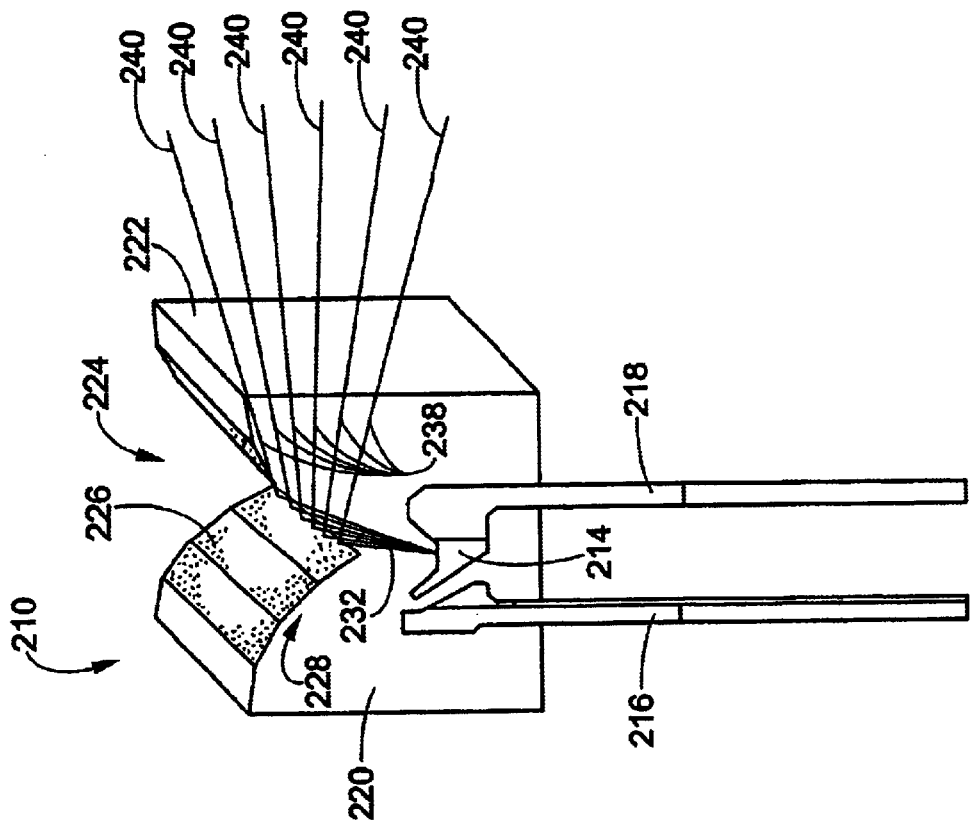
FIG. 5 is a diagram of another embodiment of the LED package wherein the encapsulant exhibits reflection symmetry and has essentially straight sides.

With reference to FIGS. 1 and 2, a preferred embodiment of the invention will be described. The light-emitting diode (LED) package or capsule 10 includes an LED die 12 and a lead frame 14 which includes a plurality of electrical leads 16, 18. For an LED diode there will usually be two leads 16, 18. The terminals of the LED are electrically connected to the electrical leads of the lead frame using conventional means known to the art, such as by wire bonds (not shown).

A transparent encapsulant 20 encapsulates at least the LED die 12. Preferably, encapsulant 20 encapsulates the LED die 12, the lead frame 14, and a portion of the electrical leads 16, 18 as illustrated in FIGS. 1 and 2. Furthermore, encapsulant 20 preferably hermetically seals the LED die 12 to prevent corrosion or degradation of the die from the outside environment, while providing sufficient heat transfer to prevent overheating of the LED die during operation. Encapsulant 20 has a preselected shape which is preferably essentially hemispherical, but which preferably includes side portions 22 having a preselected curvature, and a depression 24 located essentially opposite to LED die 12.

A reflective coating 26 is disposed upon a portion of the outer surface 28 of encapsulant 20. Reflective coating 26 may be any coating which is reflective and durable, and which is compatible with the encapsulant 20 material. In the preferred embodiment a silver oxide is used for reflective coating 26. The reflective coating is preferably disposed within and around top depression 24 essentially opposite to the surface 30 of LED die 12.

Having thus described the physical structure, the optical operation of the LED package will now be discussed with continuing reference to FIGS. 1 and 2. When powered by an appropriate external electrical source (not shown) through electrical leads 16, 18, LED die 12 emits light with a certain distribution of light intensity. The emitted light is represented in FIGS. 1 and 2 by a plurality of light rays 32, 34. LED emission intensity distribution is usually an essentially Lambertian intensity distribution, wherein the intensity of light emitted perpendicularly to the surface 30 of LED die 12, or equivalently emitted parallel to surface normal 36, represented by rays 32, is much higher than the intensity of light emitted at larger angles away from surface normal 36, such as rays 34. This results in a directional beam 32 aimed predominantly along the surface normal 36. Using prior art packaging, this directional beam 32 would travel unimpeded and exit the LED capsule as a directed beam with very different spatial intensity distribution characteristics from the intensity distribution emitted by an incandescent bulb filament or other point or line source.

In the present invention, however, directed beam 32 is intercepted by reflective coating 26. The curvature of the encapsulant 20 outer surface 28 in the vicinity of depression 24 is such that the reflected light rays 38 are directed toward the sides 22 of the capsule 10. Sides 22 preferably act as refracting surfaces 22 with a preselected curvature. Refracting surface 22 further bends the light rays to produce refracted rays 40.

With reference to FIG. 3, it will be noted that if refracted rays 40 are traced backward into the capsule 10, they approximately intersect at a point 42 near or within depression 24. Therefore, a viewer 44 observing the capsule from the side would see an apparent approximate point light source 42 near or within depression 24. In other words, the capsule behaves as an approximate point light source which emits light in a non-directional manner within a certain viewing range, or predetermined solid viewing angle, along the side of capsule 10. The viewing range or solid viewing angle is determined at least by the configuration of reflecting surface 26 and the refracting surface 22. This optical conversion from a directed light source LED die emission intensity distribution to an approximate point light source external intensity distribution is achieved through cooperation between the reflecting surface 26 and the refracting surface 22. The precise preselection of the curvatures of the reflecting and refracting surfaces so as to achieve an optimal apparent approximate point light source 42 involves conventional optical engineering methods which are well known to those skilled in the art and which need not be described here for an enabling disclosure of the invention.

Referring back again to FIG. 2, although the strongest LED die emission intensity is at angles near the surface normal 36 due to the Lambertian distribution, there is also light emission at larger angles, represented in FIG. 2 by rays 34. Preferably, lead frame 14 has reflective surfaces 46 which reflect light rays 34, producing reflected rays 48 which travel along a path approximately parallel to direct rays 32. Rays 48 are then reflected by reflecting surface 26 producing reflected rays 50 which contribute to the illumination of refracting surface 22.

In FIGS. 1–3 above, the encapsulant 20 is radially symmetric about an LED die surface normal 36. For this geometry the depression 24 and associated reflecting surface 26 are preferably also radially symmetric, producing an apparent point light source 42 when observed by a viewer 44 at essentially any side of the capsule.

Figure 4:
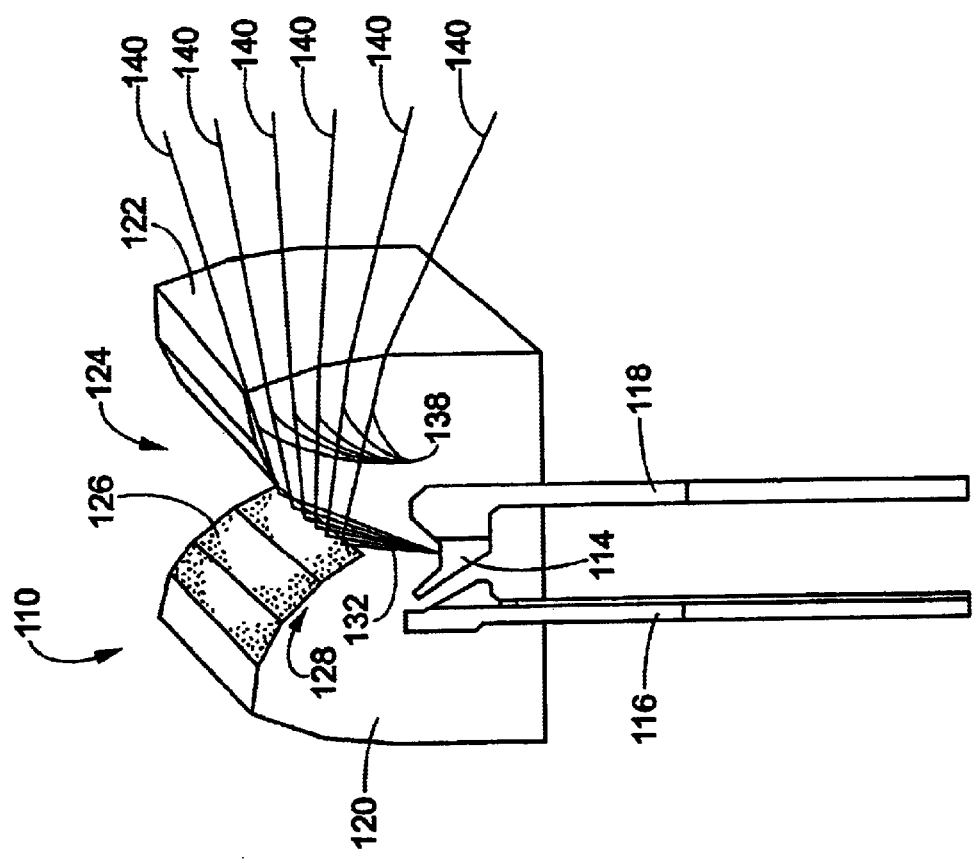
FIG. 4 is a diagram of another embodiment of the LED package wherein the encapsulant exhibits reflection symmetry.

Other encapsulant and reflecting surface geometries are also contemplated and fall within the scope of the invention. With reference to FIG. 4, an LED package 110 exhibiting a reflection symmetry is described. The LED package includes a lead frame 114 with an LED die (not shown) mounted thereon. In this alternate embodiment encapsulant 120 exhibits reflection symmetry about a plane containing an LED die surface normal (not shown). Depression 124 defined by curved surfaces 128 is an essentially linear depression preferably centered on the plane of symmetry, and reflective coating 126 is disposed on at least a portion of surface 128. Light 132 emanating from the LED die when electrically energized through leads 116, 118 reflects off reflective surface 126 to form reflected rays 138, which are in turn refracted by refracting surface 122 to form refracted rays 140. Because of the reflection symmetry of the encapsulant 120 and the preselected curvature of surfaces 128 and 122, rays 140 appear when viewed from the side to emanate from an apparent approximate line light source (not shown) located nearby and parallel to depression 124. Such a capsule 110 would be appropriate for example in situations where an incandescent bulb with a long filament is to be replaced.

With reference to FIG. 5, another LED package 210 exhibiting reflection symmetry is described. The LED package includes a lead frame 214 with an LED die (not shown) mounted thereon. In this alternate embodiment encapsulant 220 exhibits reflection symmetry about a plane containing an LED die surface normal (not shown). Depression 224 defined by curved surfaces 228 is an essentially linear depression preferably lying in the plane of symmetry, and reflective coating 226 is disposed upon at least a portion of surface 228. Light 232 emanating from the LED die when electrically energized through leads 276, 218 reflects off reflective surface 226 to form reflected rays 238 which are in turn refracted by refracting surface 222 to form refracted rays 240. Unlike the embodiment of FIG. 4, the embodiment of FIG. 5 includes essentially straight sides 222 without any curvature. As a result, the refractive surface 222 is not preselected to positively contribute to the converting of the relatively directional LED die optical output 232 into an approximate line light source (not shown). Nonetheless, with proper preselection of the curved surface 228 and accounting for the known refractive effect of the planar surface 222, rays 240 emanating from the sides of capsule 210 of FIG. 5 appear when viewed from the side to emanate from an apparent approximate line light source (not shown) located nearby and parallel to depression 224. Capsule 210 of FIG. 5 thus operates similarly to capsule 110 of FIG. 4 with respect to conversion of the optical intensity distribution.

Figure 6:
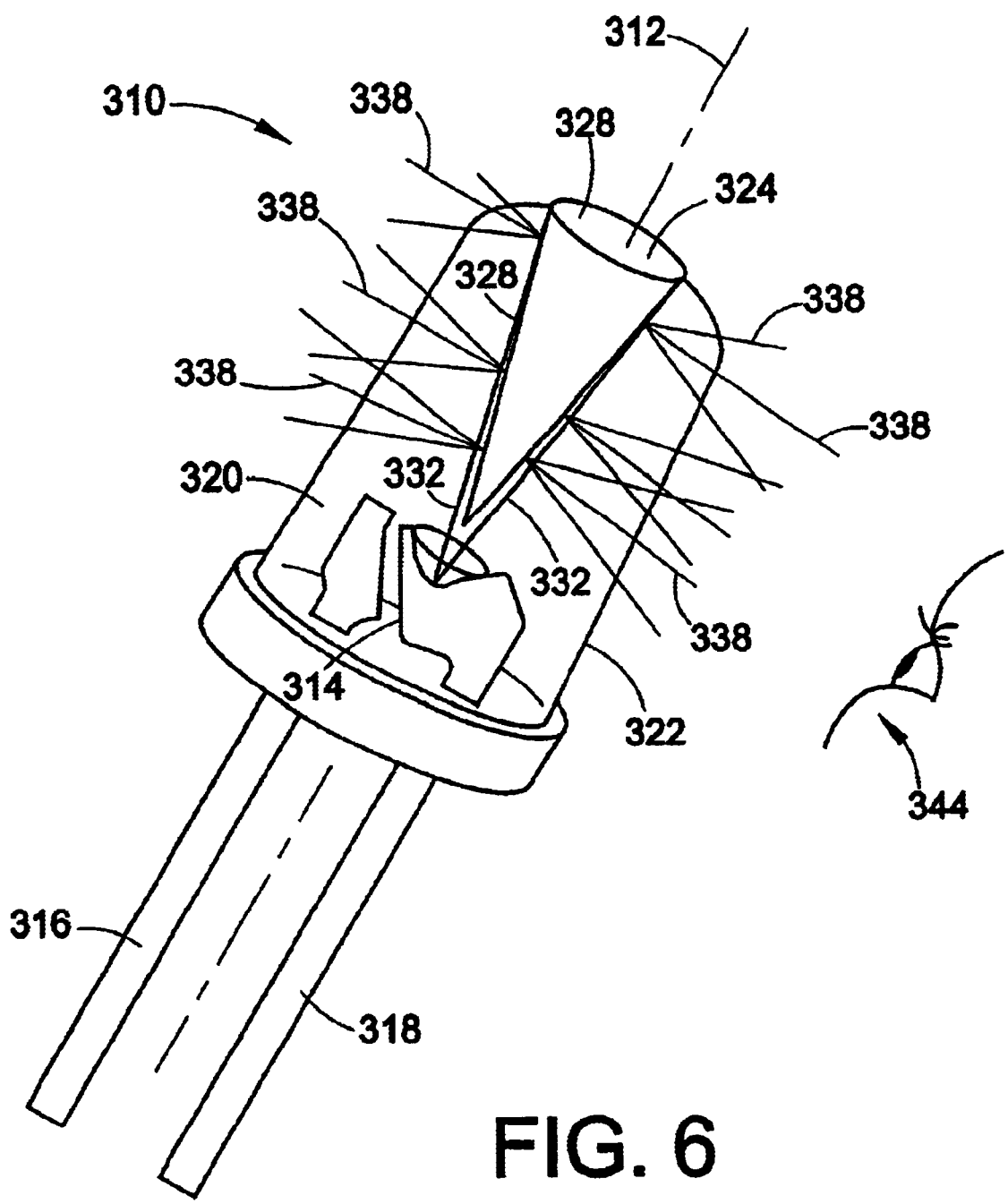
FIG. 6 is a diagram of another embodiment of the LED package wherein the encapsulant includes a roughened surface for producing an apparent extended light source.

With reference to FIG. 6, yet another LED package 310 is described. The LED package includes a lead frame 314 with an LED die (not shown) mounted thereon. In this alternate embodiment encapsulant 320 exhibits radial symmetry about a central axis 312 centered approximately on the LED die and approximately parallel to the LED die surface normal (not shown). Depression 324 defined by curved surfaces 328 is centered approximately on symmetry axis 312 and is essentially conical in shape. Unlike the embodiments of FIGS. 1–5, the embodiment of FIG. 6 preferably has a roughened depression surface 328 which acts to scatter light in a diffuse manner. Light 332 emanating from the LED die when electrically energized through leads 376, 378 scatters off surface 328. The scattering produces a diffuse reflection rather than a specular reflection, and this is indicated in FIG. 6 by a plurality of rays 338 emanating from each point where an incident ray 332 scatters off inner surface 328. Over an extended solid viewing angle, an associated viewer 344 will observe an apparent spatially extended and essentially cylindrical light source, somewhat tapered in the direction of the LED die, and essentially coincident with depression 324.

Although light rays 332 are shown in FIG. 6 as scattering off surface 328, other arrangements are also contemplated. For example, the scattering strength may be increased either by coating the outer surface 328 with a reflective coating, or by filling depression 324 with a metal or other reflective filling material which is pressed against outer surface 328 and conforms to the roughness of that surface.

The coating or filling material will approximate diffuse scattering due to conformation to roughened surface 328. It will also be recognized that other encapsulant geometries besides that shown in FIG. 6 may also be used in LED capsules employing the diffuse scattering mechanism.

An advantage of operation by diffuse scattering rather than by reflection/refraction of light rays is a greater tolerance to structural variation of the encapsulant. In specular reflection/refraction designs such as those illustrated in FIGS. 1–5, the curvature of the reflective and refractive surfaces define a ray path which will be rather sensitive to deviations in encapsulant curvature. The encapsulant formation will therefore require reasonably tight structural tolerances. In contrast, diffuse scattering off surface 328 will not be strongly affected by variations in surface 328 curvature. Additionally, because the light is scattered diffusely, any refraction occurring at side surface 322 will not significantly change the intensity distribution, and so the detailed curvature of the side surfaces is also not critical. However, the diffuse scattering mechanism produces a more extended light source with poor focusing characteristics versus a less extended point-like source.

Figure 7:
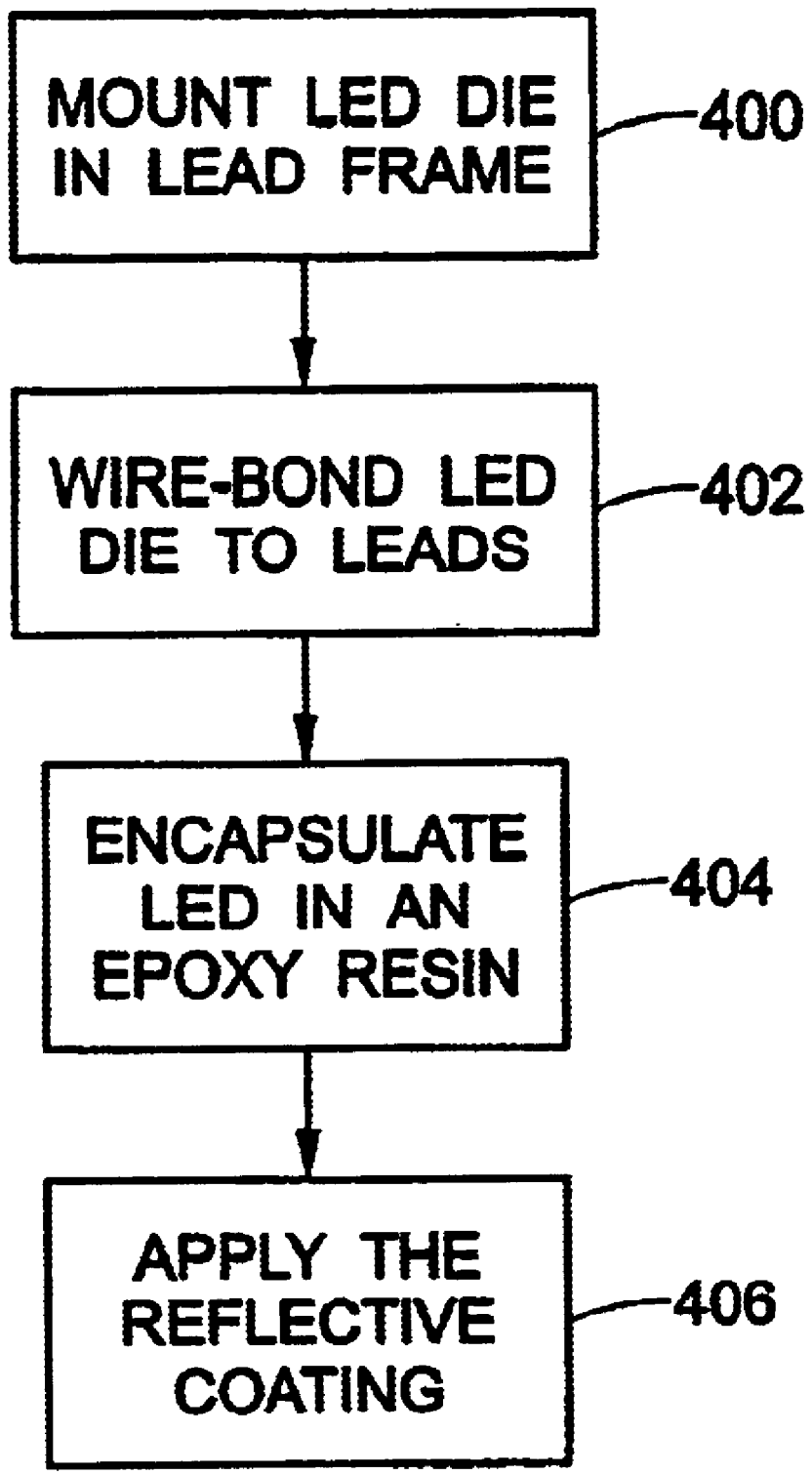
FIG. 7 is a flowchart of the LED package or capsule manufacturing process.

With reference to FIG. 7, the manufacturing process for producing the LED package or capsule will be described. The packaging process starts with an LED die and a lead frame. The manufacture of these elements using well known prior art methods need not be described for an enabling disclosure of the packaging process. The LED die is mounted to the lead frame in a step 400, preferably using an appropriate adhesive which serves the dual purposes of bonding and heat sinking the LED die. Electrical connection between the LED die contact pads and the leads of the lead frame is formed by soldering, wire bonding or the like in a step 402. The LED die, and preferably at least a portion of the lead frame, is encapsulated in an epoxy resin or the like in a step 404. The encapsulant is preferably simultaneously shaped during encapsulation by using an appropriate casting mold. For diffuse scattering designs such as that shown in FIG. 6, it may be necessary to roughen surface 328 after encapsulant formation. Alternatively, the casting mold may produce this roughened surface directly. Finally, the reflective coating or filling is applied to the appropriate encapsulant outer surface areas in a step 406. It will be noted that, with the exception of the reflective coating application step 406 and the special molding used in encapsulation step 404, the packaging process just described is identical to conventional LED packaging. The invention therefore provides a low cost method for obtaining preferred light intensity distributions using an essentially conventional LED packaging process.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light emitting diode (LED) package comprising:
   a transparent, hemispherically shaped encapsulant surrounding the LED; and
   a reflective surface disposed on the encapsulant surface opposite the LED surface, wherein the encapsulant surface near the reflective surface is spatially depressed with respect to the hemispherical shape such that LED radiation incident upon the reflective surface is reflected essentially toward a side of the package.

2. The LED package of claim 1, wherein the reflective surface and the curvature of the encapsulant surface are arranged so that LED radiation reflected from the reflective surface and subsequently exiting the encapsulant appears to an associated viewer as emanating from an approximate point light source.

3. The LED package of claim 1, wherein the reflective surface and the curvature of the encapsulant surface are arranged so that LED radiation reflected from the reflective surface and subsequently exiting the encapsulant appears to an associated viewer as emanating from an approximate line light source.

4. The LED package claim 1, wherein the reflective surface is coated with a reflective coating.

5. The LED package claim 1, wherein the encapsulant is an epoxy.

6. The LED package of claim 1, wherein the encapsulant is essentially radially symmetric about an LED surface normal.

7. The LED package of claim 4, wherein:
   the encapsulant exhibits reflection symmetry about a plane containing an LED die surface normal and the reflective surface includes an essentially linear depression; and
   the reflective coating is disposed upon at least a portion of the linear depression.

8. The LED package of claim 1, wherein the encapsulant hermetically seals the LED die.

9. A light emitting diode (LED) capsule comprising:
   an LED die;
   a hemispherically shaped transparent encapsulant which encapsulates the LED die; a reflective surface disposed on a portion of the encapsulant outer surface opposite a light emitting surface of the LED die, the reflective surface reflecting LED radiation emitting from the light emitting surface toward curved sidewalls of the LED capsule; and
   a refracting surface defined by the curved sidewalls which cooperates with the reflective surface to convert the distribution of the LED die light emission intensity into a preselected external light emission intensity distribution.

10. The LED capsule of claim 9, further including:
    a lead frame on which the LED die is mounted and electrically connected with, the lead frame including reflective lead frame portions that cooperate with the reflective and refracting surfaces to convert the distribution of the LED die light emission intensity into the preselected external light emission intensity distribution.

11. The LED capsule of claim 9, wherein the refracting surface is a portion of the encapsulant outer surface which has a preselected curvature.

12. The LED capsule of claim 9, wherein the preselected external light emission intensity distribution is an apparent approximate point source light emission intensity distribution.

13. A light emitting diode (LED) capsule including:
    a lead frame;
    an LED die mounted onto the lead frame and electrically connected thereto;
    a transparent encapsulant which encapsulates the LED die and at least a portion of the lead frame;
    a reflective surface disposed on a portion of the encapsulant outer surface generally opposite to a light-emitting surface of the LED die; and
    a refracting surface which cooperates with the reflective surface to convert a distribution of LED die light emission intensity into an apparent approximate line source light emission intensity distribution.

14. The LED capsule of claim 9, wherein the transparent encapsulant hermetically seals the LED die.

15. A light emitting diode (LED) capsule for producing an approximate extended light source with essentially uniform intensity distribution over an extended solid viewing angle, the LED capsule comprising:
    an LED die;
    a transparent encapsulant which encapsulates the LED die; and
    a roughened diffusely reflective surface disposed on at least a portion of the encapsulant outer surface generally opposite the LED die.

16. A light emitting diode (LED) capsule for producing an approximate extended light source with essentially uniform intensity distribution over an extended solid viewing angle, the LED capsule including:
    a lead frame;
    an LED die mounted onto the lead frame and electrically connected thereto;
    a transparent encapsulant which encapsulates the LED die and at least a portion of the lead frame; and
    a roughened surface depression in the encapsulant positioned essentially opposite the LED die.

17. The LED capsule of claim 16, wherein the depression is conically shaped.

18. The LED capsule of claim 16, further comprising:
    a reflective filling disposed within the depression and essentially conforming with the roughness of the roughened surface.

19. A light emitting diode (LED) capsule for producing an approximate extended light source with substantially uniform intensity distribution over an extended solid viewing angle, the LED capsule including:
    a lead frame;
    an LED die mounted onto the lead frame and electrically connected thereto;
    a transparent encapsulant which encapsulates the LED die and at least a portion of the lead frame;
    a roughened surface disposed on at least a portion of the encapsulant outer surface; and
    a coating of reflective material disposed upon at least a portion of the roughened surface.

20. The method of claim 15, wherein the encapsulant hermetically seals at least the LED die.

21. The LED package of claim 2, wherein the spatially depressed encapsulant surface near the reflective surface defines a depression, and the reflective surface includes: a reflective filling material disposed in the depression.

* * * * *